United States Patent [19]

Noro

[11] Patent Number: 5,297,211
[45] Date of Patent: Mar. 22, 1994

[54] ACOUSTIC DEVICE FOR CUSTOM INSTALLATION

[75] Inventor: Masao Noro, Hamamatsu, Japan

[73] Assignee: Yamaha Corporation, Hamamatsu, Japan

[21] Appl. No.: 817,154

[22] Filed: Jan. 6, 1992

[30] Foreign Application Priority Data

Jan. 9, 1991 [JP] Japan .................................. 3-12818
Jan. 9, 1991 [JP] Japan .................................. 3-12819

[51] Int. Cl.$^5$ .............................................. H04B 3/00
[52] U.S. Cl. .......................................................... 381/81
[58] Field of Search .............................. 381/77, 80, 81

[56] References Cited

U.S. PATENT DOCUMENTS

| | | | |
|---|---|---|---|
| 2,179,043 | 11/1939 | Kimball | 381/80 |
| 3,809,810 | 5/1974 | Walker et al. | 381/81 |
| 4,979,217 | 12/1990 | Shipley | 381/81 |
| 5,131,048 | 7/1992 | Farenelli et al. | 381/81 |

*Primary Examiner*—Forester W. Isen
*Attorney, Agent, or Firm*—Graham & James

[57] ABSTRACT

In an acoustic device for custom installation in which one can listen to music in a zone which is different from a zone where an acoustic device main unit, e.g., an audio amplifier or a CD player, is located, turning on or off of loudspeakers is remote-controlled in one zone. An remote control signal from a remote-controller is received by a remote controller signal receiver in that zone and transmitted to a switch control section (microcomputer). The switch control section identifies the particular zone in which the remote control signal has been produced and switches a transmission on/off switch to turn on or off the loudspeakers in that zone. The acoustic device also includes independent signal paths, selective mixed signal supply paths which selectively combines the remote control signals provided from the plural zones and supplies the selective combined remote control signal and all mixed signal supply path which combines all the remote control signals and supplies the combined remote control signal and a remote control signal can be supplied via one these signal paths depending upon the situation of use of acoustic devices whereby some acoustic devices can be controlled only from a single zone, others can be controlled from selected zones and still others can be controlled from all zones.

5 Claims, 9 Drawing Sheets

ACOUSTIC DEVICE FOR CUSTOM INSTALLATION

BACKGROUND OF THE INVENTION

This invention relates to an acoustic device for custom installation, i.e., an acoustic device enabling listeners to enjoy music in plural zones such as rooms in a house and, more particularly, to such device in which switching on and off of loudspeakers by listeners has been facilitated.

A custom installation of acoustic devices has been increasingly adopted in some countries, particularly in U.S.A., and several systems for custom installation have been developed. It is generally an aim of the custom installation to enable a listener to listen to music in all rooms of his house and, for this aim, devices such as an amplifier and a CD player which require a power supply are installed only in a main room (a guest room is generally used as the main room) and in-wall loudspeakers and operation panel or receiver unit for an infrared remote controller are installed in each of plural sub-rooms.

FIG. 2 shows the simplest form of such prior art system in which music can be enjoyed in a main room 10 and a single sub-room 12. In the main room 10, there are installed a receiver 14 (an acoustic device consisting of a combination of an audio amplifier and a tuner) adapted for use for plural rooms and loudspeakers 16 and 17. In the sub-room 12, there are installed loudspeakers 18 and 19 and an infrared receiver 20. As receiver terminals of the receiver 14, terminals of system A and terminals of system B are provided. The loudspeakers 16 and 17 of the main room 10 are connected to the loudspeaker terminals of the system A of the receiver 14 through cables 30 and 31 and the loudspeakers 18 and 19 of the sub-room 12 are connected to the loudspeaker terminals of the system B of the receiver 14 through cables 32 and 33. In the main room 10, an infrared command signal 23 from a remote controller 23 is received by an infrared receiving section 24 of the receiver 14. In the sub-room 12, an infrared command signal 28 from a remote controller 26 is received by the infrared receiver unit 20 and applied to a received signal input terminal of the receiver 14 through a cable 34.

A key for commanding switching on and off of each of the systems A and B is provided in a corresponding one of the remote controllers 22 and 26. When switching on of the system A is commanded, the loudspeakers 16 and 17 of the main room 10 are turned on whereas when switching on of the system B is commanded, the loudspeakers 18 and 19 of the sub-room 12 are turned on. When switching on of both the systems A and B is commanded, the loudspeakers 16–19 of the rooms 10 and 12 are all turned on so that one can listen to music in the respective rooms.

FIG. 3 shows another example of the prior art systems which utilizes two power amplifiers connected to two different sources. In the main room 35, two power amplifiers 36(A) and 37(B) are provided. A CD player 38 is connected to the power amplifier 36 and a tuner 40 is connected to the power amplifier 37. The outputs of the power amplifiers 36 and 37 are set to a proper constant tone volume. In the main room 35, there are also provided loudspeakers 39 and 41 and an operation panel 42. The operation panel 42 includes a changeover switch 44 for switching between the outputs of the power amplifiers 36 and 37 and an attenuator 46 for adjusting tone volume. There are first and second sub-rooms 48 and 50. In the first sub-room 48, loudspeakers 52 and 54 and an operation panel 56 are provided and in the second sub-room 50, loudspeakers 58 and 60 and an operation panel 62 are provided. The operation panels 56 and 62 are constructed in the same manner as the operation panel 42 in the main room 35. The outputs of the power amplifiers 36 and 37 are supplied commonly to the operation panels 42, 56 and 62 and from these panels to the loudspeakers 39, 41, 52, 54, 58 and 60. According to this device, by manual operation of the operation panels 42, 56 and 62, either one of the outputs of the power amplifiers 36(A) and 37(B) can be selected independently for each of the rooms 35, 48 and 50 and a listener can listen to the selected music at a selected tone volume.

FIG. 4 shows another prior art in which an infrared re-transmitter called "repeater" is employed. In a main room 64, there are provided a receiver 66, loudspeakers 68 and 70, a loudspeaker on/off switch 72, a repeater receiving section 74 and a repeater re-transmitter section 76. In a first sub-room 78, there are provided loudspeakers 80 and 82, a loudspeaker on/off switch 84 and a repeater receiving section 86. In a second sub-room 88, there are provided loudspeakers 90 and 92, a loudspeaker on-off switch 94 and a repeater receiving section 96. By operating remote controllers 98, 100 and 102 from the respective rooms, infrared signals are received by the repeater receiving sections 74, 86 and 96. The received signals are collected to the repeater re-transmitting section 76 of the main room 64 and re-transmitted therefrom. The re-transmitted infrared signal is received by the receiving section 104 of the receiver 66 whereby the receiver 66 can be operated from the respective rooms 64, 78 and 88.

In the system of FIG. 2, turning on and off of the loudspeakers for each of the rooms 10 and 12 can be made by a remote control operation in each room 10 or 12. Since, however, this switching operation must be made for each channel, a listener must know which channel is assigned to his room. If he erroneously makes an operation of a wrong channel, loudspeakers of a wrong room will be turned on or off. Probability of such erroneous operation is particularly high in a case where there are acoustic devices located in many rooms (i.e., channels). Moreover, in this system, operation keys of respective channels must be provided on each remote controller so that each remote controller must have a large number of keys.

In the system of FIG. 3, turning on and off of the loudspeakers of the respective rooms 35, 48 and 50 must be made by a manual operation of the attenuator 46 in the operation panels 42, 56 and 62 provided in the respective rooms. This is inconvenient because switching of these loudspeakers by a remote controller cannot be made.

In the system of FIG. 4, as in the system of FIG. 3, turning on and off of the loudspeakers in the rooms 64, 78 and 88 must be made by a manual operation of the loudspeaker on/off switches 72, 84 and 94 provided in the respective rooms 64, 78 and 88. This is also inconvenient because switching by a remote controller cannot be made.

It is, therefore, a first object of the invention to provide an acoustic system capable of enabling a listener to enjoy music in plural rooms which has overcome the above described disadvantages of the prior art systems by enabling a listener to turn on and off loudspeakers of his room accurately by a very simple operation of a remote controller.

FIG. 8 shows another example of prior art acoustic devices for custom installation. The system of FIG. 8 is one applied to a house having a main room 310 and four sub-rooms 311-314. In the main room 310, there are provided, as an acoustic device main unit 16, a receiver 318 (a combination of a tuner and an amplifier), an automatic changer type CD player 320, a cassette tape recorder 322, a video tape recorder 324 and, if necessary, power amplifiers 326 and 328. There are also provided loudspeakers 330 and 332 and an infrared receiving unit 334. An acoustic signal from the acoustic device main unit 316 is supplied from an acoustic signal line 350 to the loudspeakers 330 and 332 through the infrared receiving unit 334. The infrared receiving unit 334 includes a photo-diode and receives an infrared command signal 338 (a signal for performing various operations in the acoustic device main unit 316) from an infrared transmitter 336 (remote controller) and transmits it through a command signal line 340. In the infrared receiving unit 334, there is provided a loudspeaker relay so as to turn on and off the loudspeakers in the main room 310 by the system on/off command from the infrared transmitter 336.

In the first through fourth sub-rooms 311-314, there are provided loudspeakers 330 and 332 and infrared receiving units 334 and an acoustic signal from the acoustic device main unit 316 is supplied through acoustic signal lines 351-354. A command signal from the infrared transmitter 336 received by the infrared receiving units 334 in the respective sub-rooms 311-314 is transmitted to the main room 310 through command signal lines 351-354.

A command signal input/output unit 356 is provided in the main room 310. This unit 356 receives command signals from the rooms 310-314 transmitted through the command signal lines 340-344, combines all of these command signals and outputs a combined signal. This combined signal is supplied to re-transmitting LEDs 361-364 through a command signal line 360 for re-transmission. The re-transmitted signal is received by respective infrared receiving sections of the acoustic devices 318, 320, 322 and 324 for execution of the command.

According to the system of FIG. 8, the acoustic device main unit 316 can be controlled freely from the rooms 310-314 by using the infrared transmitter 336 but it is not possible in this system to simultaneously listen to different sources in different rooms.

As a system which has improved this problem and is enabling listeners to simultaneously listen to different sources in different rooms, there is a prior art system shown in FIG. 9. In this system, receivers 318-0 to 318-4 are provided in an acoustic device main unit 316, each receiver being used exclusively for a corresponding one of plural rooms. Received signals (command signals) from the respective rooms are supplied independently to re-transmission LEDs 361-0 to 361-4 for re-transmission and the re-transmitted signal is received by the exclusive receivers 318-0 to 318-4 for an individual control. A command signal input/output unit 356 combines command signals from the respective rooms by means of an adder 366 and supplies a combined output to the re-transmitting LEDs 362-364 through a command signal line 368 for re-transmission. The re-transmitted signals are received by source devices 320, 322 and 324 whereby these source devices are controlled from the respective rooms. For preventing receiving of a re-transmitted infrared command signal by an acoustic device other than an object device, the re-transmission LEDs 361-0 to 361-4 and 362 to 364 are attached directly on the receiving sections of the respective acoustic devices.

According to the system of FIG. 9 in which an exclusive receiver is provided for each room, listeners can simultaneously listen to different sources in different rooms, for example, a CD player 362 in the main room 310, a cassette tape recorder 363 in the first sub-room 311 and a video tape recorder 364 in the second sub-room 312.

In the system of FIG. 9, listeners can simultaneously listen to different sources in different rooms but they cannot simultaneously listen to the same kind of source in different rooms, e.g., simultaneously listen to different Compact Discs. If two CD players are provided, it is of course possible to simultaneously listen to different Compact Discs in two different rooms but, even in this case, there sometimes arises inconvenience. Let it be assumed that there is provided a CD player for exclusive use of parents in addition to a CD player which can be used commonly by all members of a family including two children. Since each source device can be controlled commonly from each room, there arises a case in which the two children use the two CD players simultaneously and the parents cannot use their own CD player.

Aside from this problem, there is a demand for an arrangement according to which a particular device can be controlled from a particular room only (e.g., the video tape recorder can be controlled only from the main room and the parents' room). In the system of FIG. 9, however, the source devices 320, 322 and 324 can be controlled commonly from all rooms and, accordingly, it is not possible to satisfy such demand.

It is, therefore, a second object of the invention to provide an acoustic device capable of limiting a controllable zone depending upon the situation of use of the respective acoustic devices whereby the acoustic device can be more conveniently used.

SUMMARY OF THE INVENTION

An acoustic device achieving the first object of the invention is an acoustic device for utilizing in a plurality of zones which are substantially acoustically partitioned from each other and comprises a plurality of loudspeakers located in the plurality of zones respectively, an acoustic device main unit which is located in one of the plural zones and is capable of providing an audio source signal and is capable of adjusting a provision state of the audio source signal, audio signal transmission paths for transmitting the audio source signal provided by the acoustic device main unit to the plurality of loudspeakers, remote control means for remotely controlling the provision state of the audio source signal of the acoustic device main unit, the remote control means comprising, remote controllers provided in the plurality of zones, for designating a command for controlling the provision state of the audio source signal of the acoustic device main unit and for producing a command signal according to a designated command, command signal receiving means for receiving the command signal produced by the remote controller, a command signal transmission path for transmitting the command signal received by the command signal receiving means to the acoustic device main unit, transmission path on/off switch means provided in each of the audio source signal transmission paths, for switching a transmission state of the transmission paths, and switch control means for controlling the transmission path on/off switch means, the switch control means comprising, inputting means for inputting the command signal received by the command signal receiving means, identifying means for identifying, when an inputted command signal is a command for switching one of the audio signal transmission paths by means of the transmission path on/off switch means, the zone where the inputted command signal is provided, and switching designation means for designating switching of the transmission path on/off switch means so that the audio signal transmission path corresponding to the identified zone is switched.

According to the invention, when turning on or off of loudspeakers is remote-controlled in one zone, this operation signal is received by the remote controller signal receiving means in that zone and transmitted to the switch control means. The switch control means identifies the particular zone in which the operation signal has been received and switches the transmission path on/off switch means to turn on or off the loudspeakers in that zone.

According to this arrangement, turning on or off of loudspeakers in a zone in which a listener desires to listen to music can be realized by designating switching on or off of the loudspeakers by using a remote controller in the zone. Accordingly, the troublesome manual operation as required in the prior art systems of FIGS. 3 and 4 is obviated and, moreover, the listener can effect turning on or off of the loudspeakers in the zone where he is located in a simple and accurate manner even if he does not know the channel of the loudspeakers so that the inconvenience which arises in the prior art system of FIG. 2 can be avoided.

An acoustic device achieving the second object of invention is an acoustic device for utilizing in a plurality of zones which are substantially acoustically partitioned from each other and comprises an acoustic device main unit which is a combination of a plurality of acoustic devices sub-units and is capable of providing an audio source signal, audio signal supply paths for supplying the audio signal provided from the acoustic device main unit to the plural zones, command signal producing means for producing a command signal for operating the acoustic device main unit individually from each of the zones, independent signal supply paths for supplying the command signal produced from one of the zones independently to a specified acoustic device sub-unit provided in the acoustic device main unit independently for said zone, and selective mixed signal supply paths for combining the command signals from any selected zones among the plural zones and supplying a combined command signal to a specified acoustic device sub-unit provided in the acoustic device main unit commonly for these selected zones.

According to the invention, the independent signal supply paths, selective mixed signal supply paths and all mixed signal supply path are provided and, therefore, a command signal can be supplied via one of these signal paths depending upon the situation of use of the respective acoustic devices whereby some acoustic devices can be controlled only from a single zone, others can be controlled from selected plural zones and still others can be controlled from all zones.

In one aspect of the invention achieving the second object of the invention, an acoustic device for utilizing in a plurality of zones which are substantially acoustically partitioned from each other comprises an acoustic device main unit which is a combination of a plurality of acoustic devices sub-units and is capable of providing an audio source signal, audio signal supply paths for supplying the audio signal provided from the acoustic device main unit to the plural zones, command signal producing means for producing a command signal for operating the acoustic device main unit individually from each of the zones, and a command signal input-output unit comprising command signal input terminals for receiving command signals from said zones, independent signal output terminals for transmitting the inputted command signal independently to an acoustic device sub-unit provided in the acoustic device main unit for a corresponding one of the zones, selective mixing means for combining command signals of specified zones among the inputted command signals, selective mixed signal output terminals for transmitting selective combined command signal provided from the selective mixing means to an acoustic device sub-unit provided in the acoustic device main unit commonly for the selected zones, all mixing means for combining all of the inputted command signals, and an all mixed signal output terminal for transmitting an all combined command signal provided from the all mixing means to an acoustic device sub-unit provided in the acoustic device main unit commonly for all of the plural zones.

According to this aspect of the invention, combination and distribution of command signals can be simplified and carrying out of the invention can thereby be facilitated.

The invention will now be described with reference to the accompanying drawings.

BRIEF DESCRIPTION OF THE DRAWINGS

In the accompanying drawings.

DESCRIPTION OF PREFERRED EMBODIMENTS

First embodiment

Figure 1:
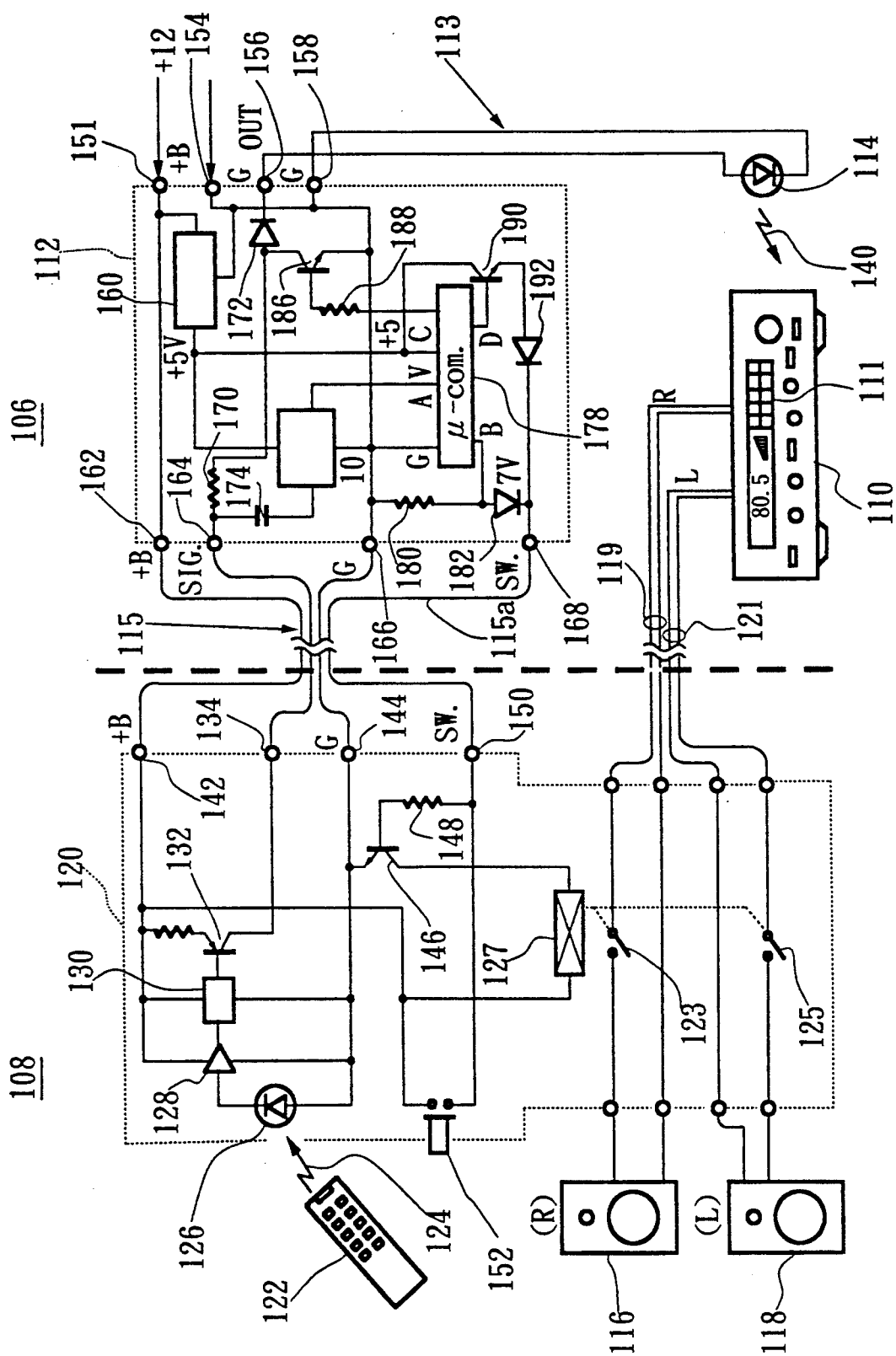
FIG. 1 is a circuit diagram showing an embodiment of the invention.
Figure 2:
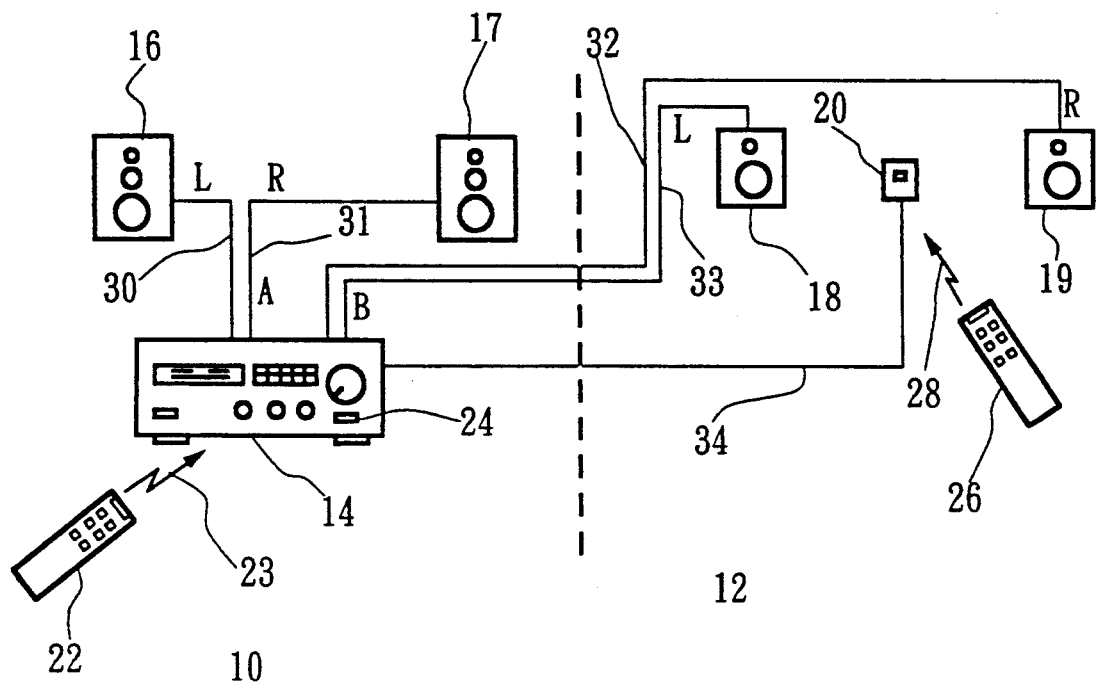
FIG. 2 is a diagram showing a prior art system.
Figure 3:
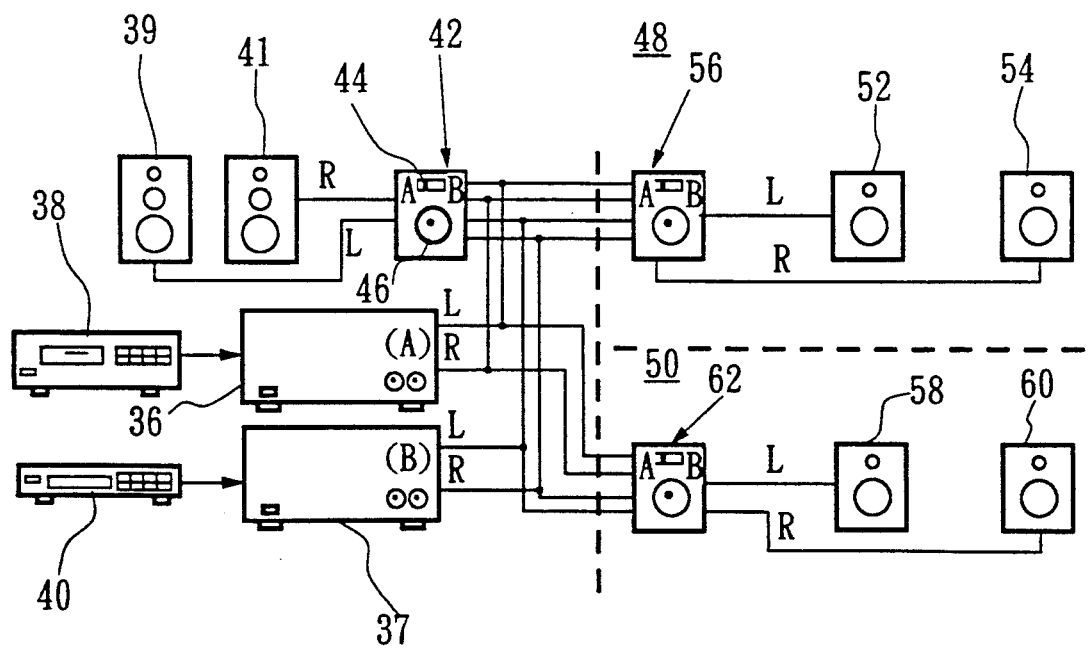
FIG. 3 is a diagram showing another prior art system.
Figure 4:
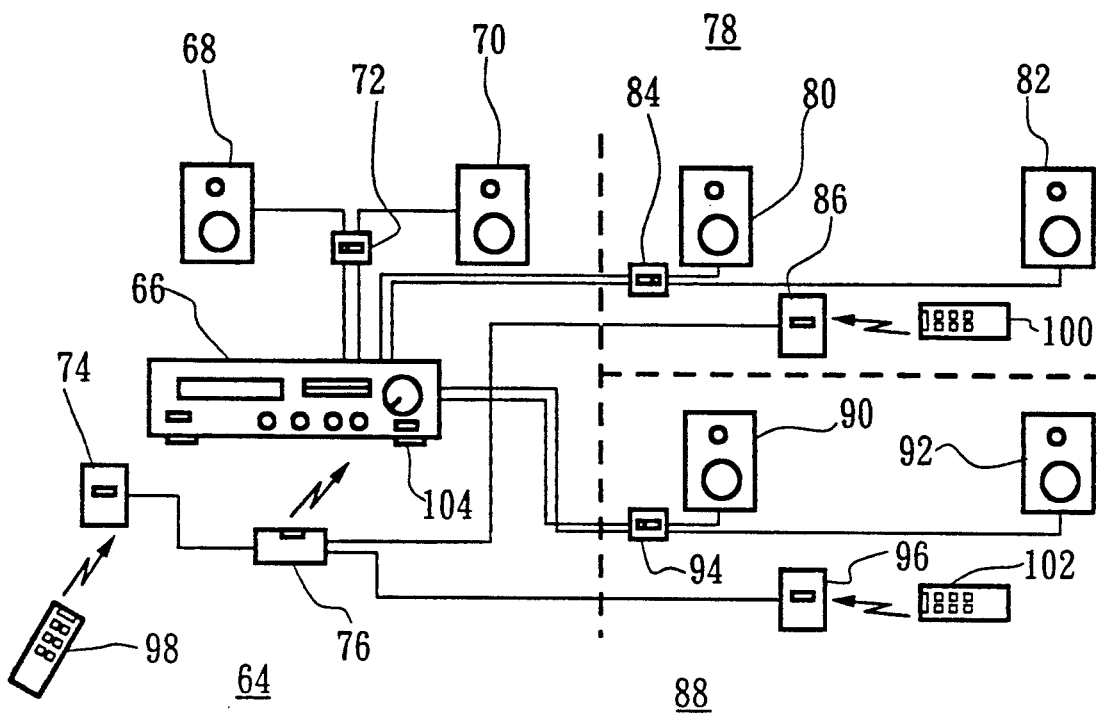
FIG. 4 is a diagram showing another prior art system.

Referring first to FIG. 1, an embodiment of the invention will be described.

For brevity of description, it is assumed that there are a main room 106 and a single sub-room 108 only. In this embodiment, a repeater system (a system in which an infrared re-transmitter is used) is used for controlling on/off of loudspeakers in the sub-room 108. A receiver 110 and a re-transmission unit 112 are provided in the main room 106. The receiver 110 is constructed as a combination of an audio amplifier and a tuner and is installed at a location such as inside of the wall where the receiver is not seen from outside. The re-transmission unit 112 is fixed to a wall surface or the like place. To the re-transmission unit 112 is connected a re-transmission infrared LED 114 through a movable or stationary cable 113. The re-transmission infrared LED 114 is disposed in the vicinity of the receiver 110 and an infrared command signal 140 which is re-transmitted from the re-transmission LED 114 is received by a receiving section in the receiver 110 for execution of an operation corresponding to contents of a command.

In the sub-room 108, there are provided loudspeakers 116 and 118 and a receiving unit 120 which receives an infrared command signal 124 from an infrared transmitter (i.e., remote controller) 122. The infrared transmitter 122 includes various keys for operating the receiver 110 and a system on/off key for switching on and off the entire system (i.e., switching on and off re-transmission of an infrared signal and transmission of a music signal to the loudspeakers 116 and 118). The system on/off key is made of a single key and a command for switching the system from one to the other of on and off states is issued each time the switch is pushed. When a system-on command has been issued, the loudspeakers 116 and 118 are turned on and the repeater operation is enabled. When a system-off command has been issued, the loudspeakers 116 and 118 are turned off and the repeater operation is disabled.

The receiving unit 120 is fixed to a wall surface or the like place of the sub-room 108 and is connected to the re-transmission unit 112 of the main room 106 through a plurality of cables 115 which are laid through the wall. Loudspeaker cables 119 (right channel) and 121 (left channel) extending from the receiver 110 through the wall are connected to the loudspeakers 116 and 118 through the receiving unit 120. Relay contacts 123 and 125 are provided as loudspeaker switches (transmission path on/off switch means) in the portions of the loudspeaker cables 119 and 121 located in the receiver unit 120. These relay contacts 123 and 125 are commonly turned on and off by a relay coil 127.

A photo-diode 126 (remote controller signal receiving means) for receiving the infrared command signal 124 from the infrared transmitter 122 is provided in the receiving unit 120. The received signal of the photo-diode 126 is amplified by an amplifier 128 and a necessary band only is extracted by a filter amplifier 130. The output of the filter amplifier 130 is applied to the base of a transistor 132 and supplied to a terminal 134 after being converted to a current change value.

To a terminal 142 of the receiving unit 120 is supplied a power supply +B (=12 V) through the re-transmission unit 112. A terminal 144 is grounded through the re-transmission unit 112. The relay coil 127 is connected between the power supply +B and the ground through a transistor 146. The base of the transistor 146 is connected to a terminal 150 through resistance 148. When voltage of this terminal 150 has become a positive value, the transistor 146 is turned on to energize the relay coil 127 and thereby turn on the loudspeakers 123 and 125.

When the voltage of the terminal 150 has become zero, the transistor 146 is turned off to deenergize the relay coil 127 and thereby turn off the loudspeakers 123 and 125.

A push-button switch 152 for turning on and off the system by manual operation is provided in the receiving unit 120. This push-button switch 152 is manually operated and the system is turned on while the switch 152 is being pushed and is turned off when the switch 152 is released. The push-button switch 152 is connected between the power supply +B and the terminal 150. When the push-button switch is pushed, the relay coil 127 is energized and the loudspeakers 123 and 125 are thereby turned on. The on-state of the relay coil 127 is held by operation of the re-transmission unit 112 even after release of the push-button switch 152, as will be described more fully later. When the push-button switch 152 is pushed again, the relay coil 127 is deenergized and thereafter energization and deenergization of the relay coil 127 are repeated each time the push-button switch 152 is pushed.

To a terminal 151 of the re-transmission unit 112 is supplied the power supply +B (=12 V). A terminal 154 is grounded. The re-transmission infrared LED 114 is connected between terminals 156 and 158 through the cable 113. A regulator 160 produces a power supply of +5 V from the power supply of +12 V. Terminals 162, 164, 166 and 168 in the re-transmission unit 112 are connected to the terminals 142, 134, 144 and 150 of the receiving unit 120 through the cables 115.

The received signal provided from the terminal 134 of the receiving unit 120 is applied to the terminal 164 of the re-transmission unit 112 and supplied to the re-transmission infrared LED 114 through resistance 170 and a diode 172 and re-transmitted from the LED 114. The re-transmitted infrared command signal 140 is received by a receiving section 111 of the receiver 110 for execution of contents of a command. The received signal applied to the terminal 164 is converted to a voltage change value by the resistance 170 and a dc component thereof is removed by a capacitor 174. The received signal thereafter is detected by a detection circuit 176 and applied to A input of a microcomputer 178.

The microcomputer 178 is grounded in its G input and receives power supply of +5 V at its V input. Resistance 180 and a Zener diode (Zener voltage=7 V) are connected between the terminals 166 and 168 and voltage at the middle point is applied to B input of the microcomputer 178. The microcomputer 178 has C and D outputs. These outputs C and D provide voltages of opposite levels such that when one of them provides an "H" level, the other provides an "L" level.

Upon receiving the received signal detection output from the A input, the microcomputer 178 identifies its code and inverts the C and D outputs each time it identifies the system on/off command. When the B input becomes positive, the microcomputer 178 likewise inverts the C and D outputs. A transistor 186 is connected between a received signal line 184 for re-transmission and the ground and the C output of the microcomputer 178 is applied to the base of the transistor 186 through resistance 188. Accordingly, when the C output is "H", the transistor 186 is turned on and the received signal line 184 is grounded and re-transmission thereby is stopped. When the C output is "L", the transistor 186 is turned off and the light receiving signal is supplied to the re-transmission LED 114 through the received signal line 184 for re-transmission.

The terminal 168 of the re-transmission unit 112 is connected to the power supply of +5 V through a diode 192 and a transistor 190 provided as a current buffer. The transistor 190 receives the D output of the microcomputer 178 at its base. Accordingly, when the D output of the microcomputer 190 is "H", the transistor 190 is turned on and voltage from the power supply of +5 V is applied to the base of the transistor 146 through the cable 115a. The transistor 146 thereby is turned on and the relay coil 127 is energized to turn on the loudspeaker switches 123 and 125. When the D output is "L", the transistor 190 is turned off and the transistor 146 thereby is turned off to turn off the loudspeaker switches 123 and 125. When the push-button switch 152 has been pushed, the power supply of +12 V is applied to the Zener diode 182 through the cable 115a and the B input of the microcomputer 178 thereby becomes +5 V to cause the C and D outputs to be inverted. When the D output has been inverted from "L" (i.e., system-off) to "H" (i.e., system-on) at this time, voltage from the power supply +5 V is applied to the base of the transistor 146 of the receiving unit 120 through the cable 115a, so that the energized state of the relay coil 127 is maintained even if the push-button switch 152 is released.

The operation of the circuit of FIG. 1 will now be described.

It is assumed that the system is off in the initial state. At this time, the C output of the microcomputer 178 is "H" and the D output thereof is "L". The transistor 186 is in an on state and a received signal from the receiving unit 120 is not supplied to the re-transmission LED 114. The relay coil 127 is deenergized. The output of the receiver 110 is not supplied to the loudspeakers 116 and 118 which therefore do not produce sound. At this time, the receiver 110 does not respond even if a key of the infrared transmitter 122 is operated.

When the system on/off key of the infrared transmitter 122 has been pushed, this signal is received by the photo-diode 126 and transmitted through the cable 115 to the microcomputer 178. The microcomputer 178 identifies its code and the C and D outputs thereof are inverted so that the C output becomes "L" and the D output becomes "H". The transistor 146 thereby is turned on to energize the relay coil 127. This causes the loudspeaker switches 123 and 125 to be turned on and the loudspeakers 116 and 118 produce sound. Simultaneously, the transistor 186 is turned off to enable the re-transmission infrared LED 114 to re-transmit an infrared signal so that the receiver 110 can be controlled by the infrared transmitter 122. When the system on/off key of the infrared transmitter 122 has been pushed again, the C and D outputs of the microcomputer 178 are inverted again to turn off the system.

Operations such as switching of tone volume and source and selection of music in the tuner can conveniently be made by the remote controller 122. For simply turning on or off music in the sub-room 108 where the receiving unit 120 is installed, however, it is sometimes more quick and convenient to provide a switch in this sub-room 108 and operate this switch manually. In the system of FIG. 1, as described above, the manual push-button switch 152 is provided in the receiving unit 120. This push-button 152 has the entirely same function as the system on/off key of the infrared transmitter 122. For reducing the number of wires, in this embodiment, the single cable 115a is concurrently used for transmitting information representing that the push-button 152 has been pushed to the re-transmission unit 112 and transmitting a relay drive signal from the re-transmission unit 112 to the receiving unit 120.

Upon pushing the push-button switch 152 from the system-on state, the relay coil 127 is energized and the loudspeaker switches 123 and 125 are turned on. The power supply of +12 V is supplied to the terminal 168 of the re-transmission unit 112 through the cable 115a. At this time, the power supply of +5 V resulting from dropping by 7 V through the Zener diode 182 is applied to the B input of the microcomputer 178 to invert the C and D outputs thereof. Since the D output is "H" even after release of the push-button switch 152, voltage at the terminal 168 becomes about +3.8 V thereby maintaining the on state of the transistor 146 through the cable 115a and holding the on state of the loudspeaker switches 123 and 125. Since this voltage of +3.8 V is lower than the Zener voltage (+7 V) of the Zener diode 182, it is not applied to the B input of the microcomputer 178.

Figure 5:
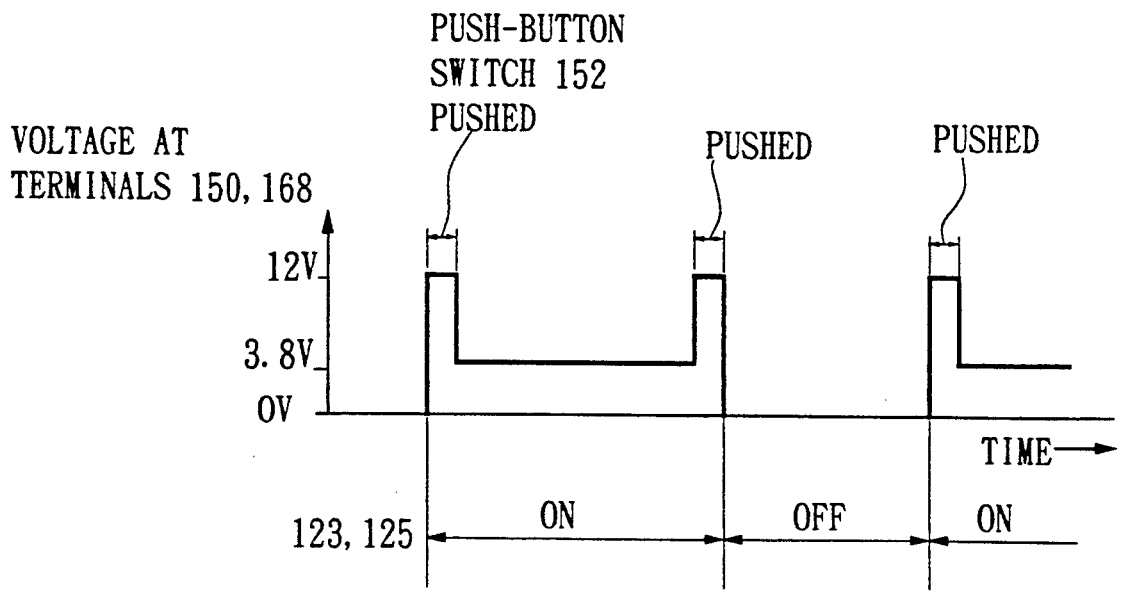
FIG. 5 is a diagram showing change in voltage at terminals 150 and 168 by operation of a push botton switch of FIG. 1.

Upon pushing the push-button switch 152 again, the C and D outputs of the microcomputer 178 are inverted and, when the push-button 152 has been released, the D output has been turned to "L", so that the terminal 168 becomes 0V. The transistor 146 thereby is turned off and the loudspeaker switches 123 and 125 are turned off. Voltage change at the terminals 150 and 168 by the operation of the push-button switch 152 is shown in FIG. 5.

In the above described manner, each time the system on/off key of the infrared transmitter 122 or the push-button switch 152 is pushed, the system-on state (re-transmission enabled and loudspeakers 116 and 118 of the listener's room turned on) and the system-off state (re-transmission stopped and loudspeakers 116 and 118 of the listener's room turned off) are switched. According to the construction of FIG. 1, no provision of a special arrangement is necessary in the receiver 10 for realizing the invention but a conventional receiver can be used without any modification, so that the construction can be readily realized. Since the loudspeaker on/off relay (i.e., relay coil 127 and the loudspeaker switches 123 and 125) is provided in the receiving unit 120, the loudspeakers 116 and 118 and the loudspeaker cables 119 and 121 have only to be connected to the terminals of the receiving unit 120 and this facilitates connection. Further, since the entire receiving unit 120 may be replaced at the time of failure, repair is very simple. Furthermore, since the turning on and off of the loudspeakers 123 and 125 are interlocked with turning on and off of the repeater function, a system in which possibility of erroneous operation is small and which is very easy to use can be realized.

Second embodiment

In the embodiment of FIG. 1, only one receiving unit 120 is provided and the input of the re-transmission unit 112 is also one. This construction is assumed only for convenience of description and it should be noted that in an actual system in which control from plural rooms is intended, the receiving unit 120 is provided in each of the plural rooms and the re-transmission unit 112 has plural inputs in correspondence thereto. In this case, it is not necessary to provide plural re-transmission outputs for the re-transmission unit 112 but received signals from the respective rooms may be mixed and a mixed signal may be supplied to a single re-transmission LED 114 to control the receiver 110. The diode 172 in the re-transmission unit 112 in FIG. 1 is provided for preventing reverse flow of current which occurs in that case and, by this arrangement, the function of the transistor 186 for stopping re-transmission is made independent for each channel.

Figure 6:
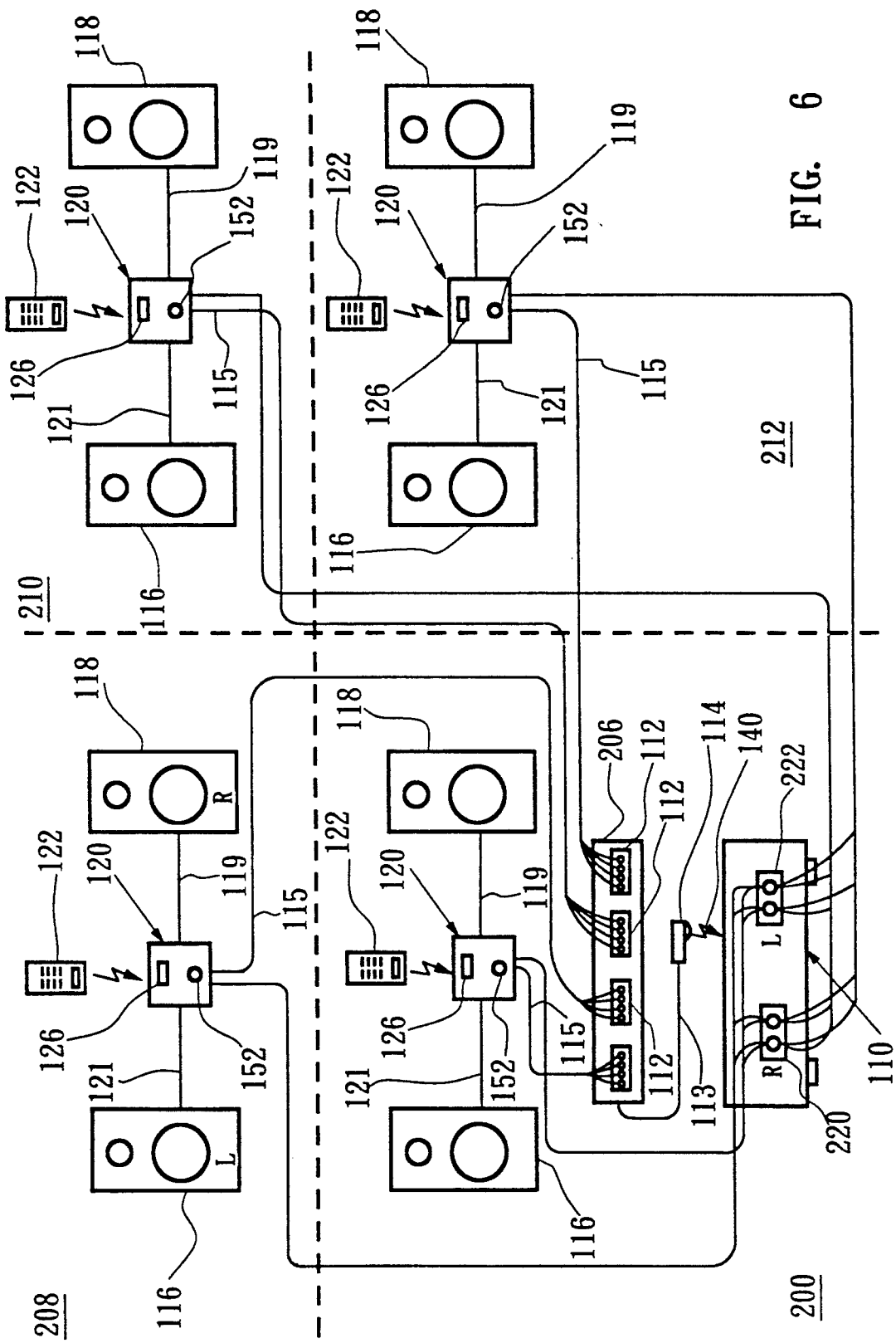
FIG. 6 is a circuit diagram showing another embodiment of the invention.

FIG. 6 is an embodiment in which the invention is applied to four rooms (one main room and three sub-rooms). In this embodiment, sound can be produced and the receiver can be controlled in a room in which the system has been turned on by operation of a remote controller or a push-button switch. Since turning on and off of the loudspeakers are interlocked with turning on and off of the repeater function, a system in which possibility of erroneous operation is small and which is easy to use can be realized.

In the main room 200, there are provided a receiver 110 (acoustic device main unit), loudspeakers 116 and 118, a receiving unit 120 and a re-transmission section 206. To the re-transmission section 206 is connected a re-transmission infrared LED 114 through a cable 113 and this LED 114 is provided at a location where an infrared signal from this LED 114 can be received by a receiving section of the receiver 110. The main room 200 is a room where the receiver 110 is provided and it is possible to control the receiver 110 directly by the infrared transmitter 122. Since, however, acoustic devices of this type of system are generally housed inside the wall and cannot be seen from outside, the receiving unit 120 is provided also in the main room 200. The receiving unit 120 is constructed in the same manner as the receiving unit 120 of FIG. 1.

The re-transmission section 206 is constructed in such a manner that the re-transmission unit 112 of FIG. 1 is provided for each room and all of the re-transmission units 112 are assembled into a single device. The re-transmission unit 112 is constructed in the same manner as the re-transmission unit 112 of FIG. 1. The four re-transmission units 112 are connected commonly at their terminals 156 and 158 (FIG. 1) and the re-transmission infrared LED 114 is commonly connected thereto through a cable 113. Each of the re-transmission units 112 is connected to a corresponding receiving unit 120 of each room through a cable 115. In this case, each re-transmission unit 112 is made independent by the diode 172 (FIG. 1) as described previously and, accordingly, received signals from the rooms 200, 208, 210 and 212 are independently supplied to the re-transmission infrared LED 114.

In the first to third sub-rooms 208, 210 and 212, there are provided the loudspeakers 116 and 118 and the receiving unit 120. The receiving unit 120 is constructed in the same manner as the receiving unit 120 of FIG. 1 and a photo-diode 126 receiving an infrared command signal from the remote controller and a push-button switch 152 for manually switching on and off the system are provided therein. The loudspeakers 116 and 118 of each room are connected commonly to loudspeaker terminals 200 and 222 of the receiver 120 through loudspeaker cables 119 (right channel) and 121 (left channel).

In the embodiment of FIG. 6, when the system on/off key of the infrared transmitter 122 has been operated in some room, an infrared signal is received by the receiver unit 120 of that room and supplied to a corresponding re-transmission unit 112 of the re-transmission section 206. The microcomputer 178 identifies its code and the C and D outputs of the microcomputer 178 are inverted. The on/off states of transistors 146 and 186 are switched to enable or disable operation of the receiver 110 from this room and the loudspeaker switches 123 and 125 of that room are turned on or off (FIG. 1). The same operation is performed when the push-button switch 152 is pushed. Thus, by commanding turning on or off of the system in each room, the system is turned on or off only in that room.

In the above described embodiments, the loudspeaker switches 123 and 125 are provided in the receiving unit 120. The location of the loudspeaker switches 123 and 125 is not limited to this but these switches may be provided at any place so long as they can individually turn on and off the acoustic signal transmission path to each room. The location of the relay coil 127 is not limited to inside of the receiving unit but it may be provided at any place so long as it can turn on and off the loudspeaker switches 123 and 125.

In the above described embodiment, the re-transmission unit 112 is provided in the vicinity of the main room but it may be provided in a sub-room (e.g., in the receiving unit 120). In this case, the re-transmission LED 114 only should be provided in the vicinity of the receiver 110. In the embodiment of FIG. 6, the re-transmission unit 112 is provided in each room. Alternatively, a single microcomputer 178 may be shared by the respective rooms. In that case, turning on and off of a system of a particular room can be controlled by, for example, sending information identifying the room together with a detection output from the detection circuit 176 or constructing the microcomputer 178 so that it receives signals from the respective rooms at separate ports.

In the above described embodiments, the system on/off key of the infrared transmitter 122 and the push-button switch 152 are constructed in such a manner that switching on and off are both made by a single key or push-button. Alternatively, switch-on and switch-off may be made by different keys.

In the above described embodiments, the acoustic device main unit is constructed of the receiver 110. The acoustic device main unit may also be constructed of other devices. The acoustic device main unit need not be a single device but may be constructed of plural devices.

In the above described embodiments, the invention is applied to a system using a repeater. The invention however is applicable to other systems (e.g., a system in which a signal is transmitted from the receiving unit 120 to the acoustic device main unit through a cable).

In the above described embodiments, the infrared signal is transmitted by a remote controller. Alternatively, a radio signal may be used. It is also possible to transmit a music signal to loudspeakers in respective zones by a radio transmission.

The invention is applicable not only to rooms in a house but various other zones.

Third embodiment

Figure 7:
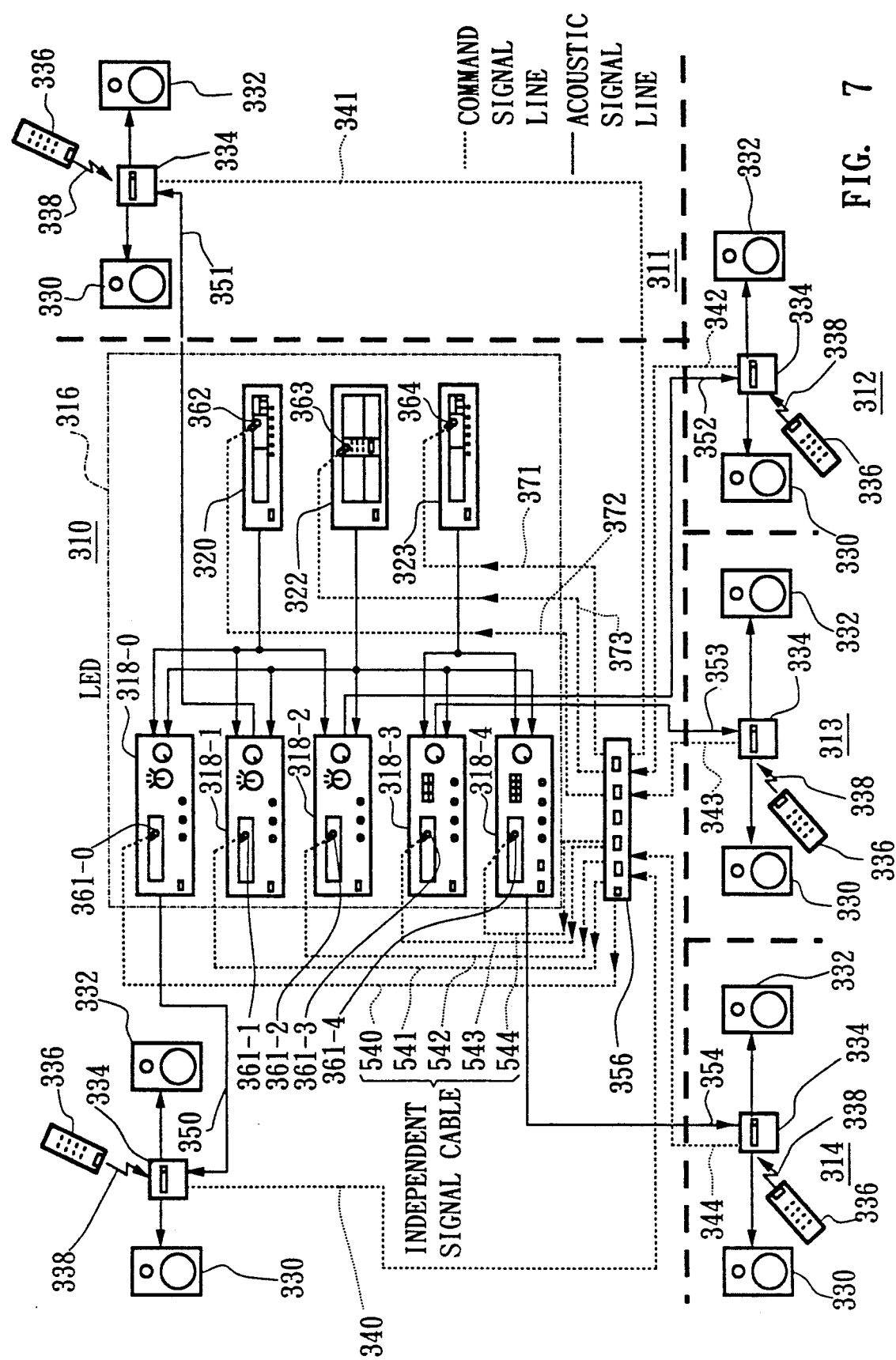
FIG. 7 is a circuit diagram showing another embodiment of the invention.
Figure 8:
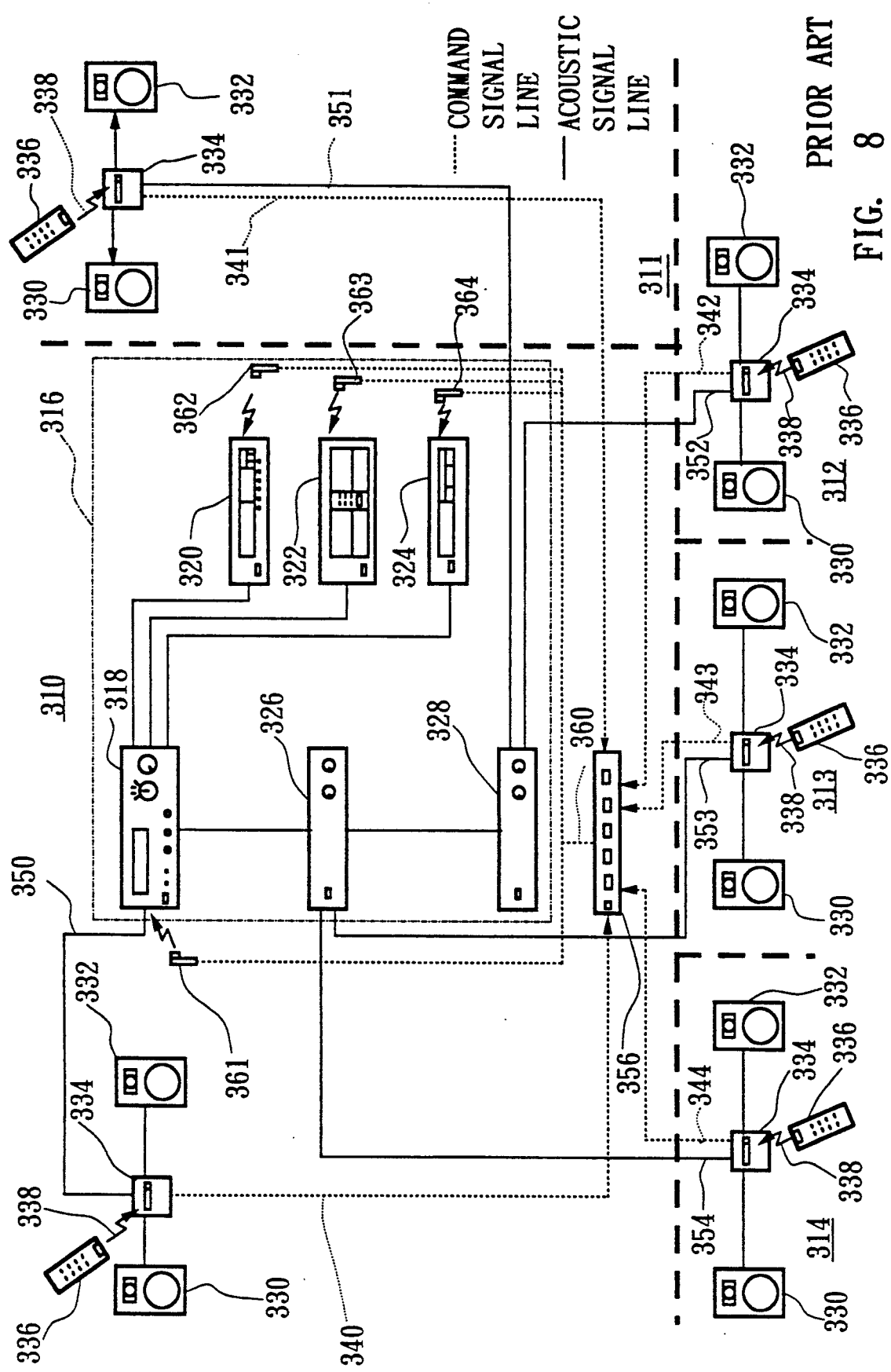
FIG. 8 is a diagram showing another prior art system.
Figure 9:
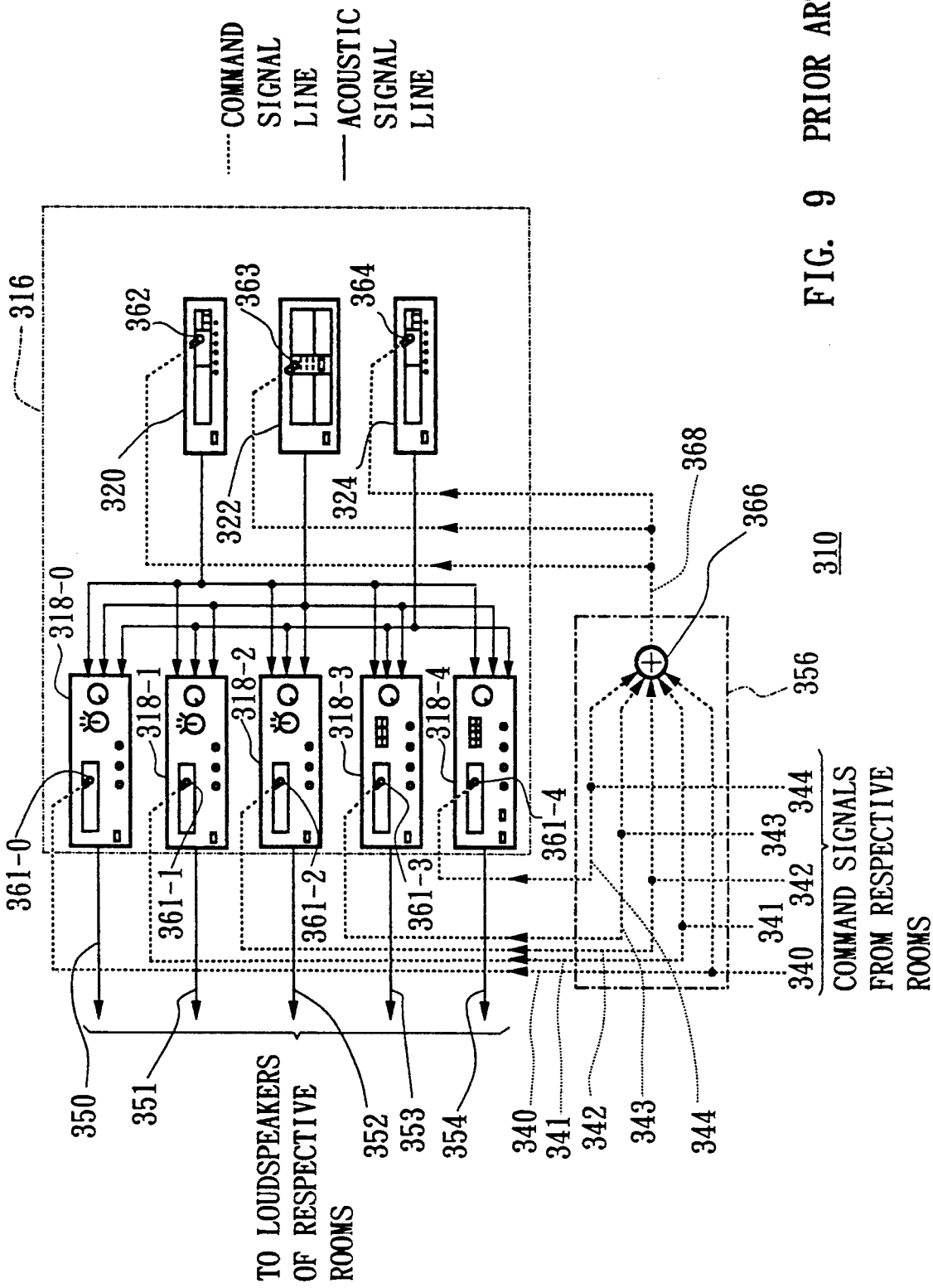
FIG. 9 is a diagram showing still another prior art system.

Referring now to FIG. 7, an embodiment of the acoustic device achieving the second object of the invention will be described.

FIG. 7 schematically shows an arrangement of the acoustic device in a house to which this invention is applied. This house has a main room 310 and four sub-rooms 311-314. In the main room 310, there are provided, as an acoustic device main unit 316, receivers 318-0 to 318-4 which are exclusively used for the respective rooms, a CD player 320, a cassette tape recorder 322 and a CD player 323. The acoustic device main unit 316 is housed in an unseen place such as inside of the wall. As the CD players 320 and 323, automatic changer type CD players are generally used. There are also provided loudspeakers 330 and 332 and a receiving unit 334 in the main room 310. An acoustic signal from the receiver 318-0 of the acoustic device main unit 216 is supplied from an acoustic signal cable 350 to the loudspeakers 330 and 332 through the receiving unit 334. The receiving unit 334 incorporates a photo-diode, receives an infrared command signal 338 (a command signal for performing various operations in the acoustic device main unit 316) from an infrared transmitter 336 and outputs it through a command signal line 340.

Loudspeakers 330 and 332 and a receiving unit 340 are provided respectively in the first to fourth sub-rooms 311-314. Acoustic signals from the receivers 318-1 to 318-4 of the acoustic device main unit 316 are supplied through acoustic signal lines 351-354. Command signals from the infrared transmitters 336 received by the receiving units 334 in the sub-rooms 311-314 are transmitted to the main room 310 through command signal lines 341-344. A loudspeaker relay is provided in the receiving unit 334 in each of the rooms 310-314 so that loudspeakers of the listener's room can be turned on or off by issuing a system-on command or a system-off command from the infrared transmitter 336 in his room.

A command signal input/output unit 356 is provided in an unseen place such as inside of the wall of the main room 310. This unit 356 receives command signals from the rooms 310-314 transmitted through the command signal lines 340-344. To the command signal input/output unit 356 are connected independent signal cables 540-544 for outputting command signals from the respective rooms 310-314, selective mixed signal cables 371 and 372 for outputting a mixed signal of selected command signals among command signals from the respective rooms 310-314, and an all mixed signal cable 373 for outputting a mixed signal of all command signals from the rooms 310-314. The respective command signals are supplied to the command signal input/output unit 356 through these command signal cables. An independent signal is transmitted to an acoustic device which is independently provided for a single room. A selective mixed signal is transmitted to an acoustic device which is provided commonly for plural rooms and an all mixed signal is transmitted to an acoustic device which is provided for all rooms 310-314. In this embodiment shown in FIG. 7, an independent signal is transmitted to one of the receivers 318-0 to 318-4 corresponding to the listener's room. In a case where, for example, the CD player 320 is used in the rooms 310, 311 and 312 which are mainly used by the parents and the CD player 323 is used in the children's rooms 313 and 314, command signals from the rooms 310, 311 and 312 are selectively mixed and transmitted to the CD player 320 and command signals from the rooms 313 and 314 are selectively mixed and transmitted to the CD player 323. A cassette tape recorder 322 is intended to be used in all rooms 310-314, so that command signals from all rooms 310-314 are mixed and transmitted to the cassette tape recorder 363. These command signals are transmitted by re-transmission LEDs 361-0 to 361-4 and 362-364 to the respective devices 318-0 to 318-4, 320, 322 and 323.

According to the above described construction, the corresponding receivers 318-0 to 318-4 can be independently operated from the respective rooms 310-314, the CD player 320 can be commonly operated from the rooms 310-312 used mainly by the parents, the CD player 323 can be commonly operated from the children's rooms 313 and 314 and the cassette tape recorder can be operated commonly from all rooms.

Figure 10:
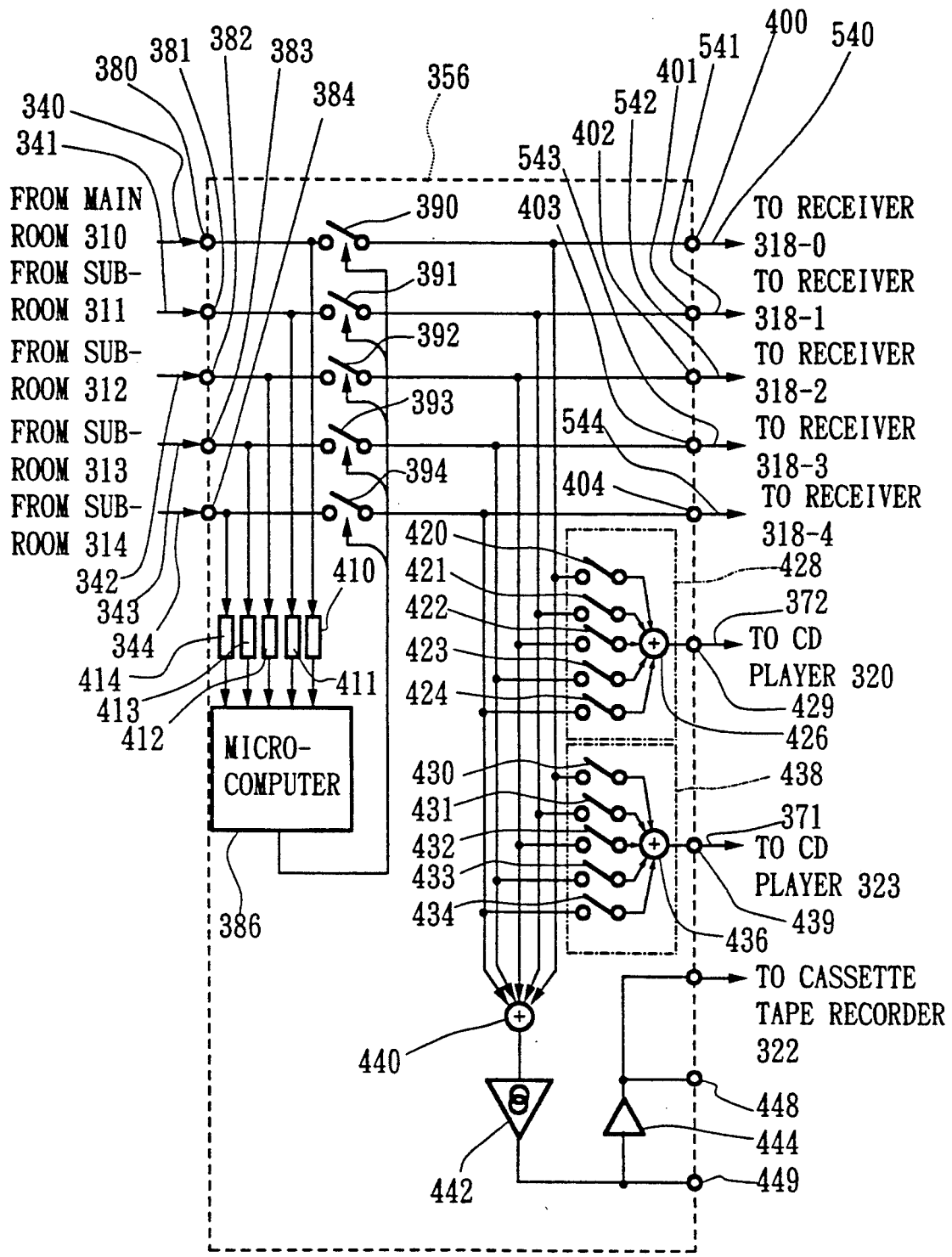
FIG. 10 is a circuit diagram showing an example of internal structure of a command signal input/output unit 356 of FIG. 7.

An example of construction of the command signal input/output unit 356 is shown in FIG. 10. Command signals from the respective rooms 310-314 are applied to command signal input terminals 380-384, delivered out directly from independent signal output terminals 400-404 through switches 390-394 and supplied to the receivers 318-0 to 318-4. Detection circuits 410-414 detect command signals of the respective rooms. An operation key for turning on and off a system of each room is provided in the infrared transmitter 336 (FIG. 7) of the room. By operating this key, its command signal is transmitted through the receiving unit 334 and is applied to a microcomputer 386 through one of the detection circuits 410-414. The microcomputer 386 thereupon turns on or off a corresponding one of the switches 390-394. Transmission of a command signal from the listener's room to the acoustic device main unit 316 is thereby permitted or stopped so that the system of his room can be turned on or off and an erroneous operation can be prevented by producing a command signal to only a necessary room. By turning on and off the loudspeaker relay (provided in the receiving unit 334 (FIG. 7)), the loudspeakers of his room can be concurrently turned on or off. The loudspeaker relay can be turned on and off by, for example, supplying a switch control output of the microcomputer 386 to the receiving unit 334 in the respective rooms 310-314 through the cable.

Switches 420-424 and an adder 426 constitute selective mixing circuit 428. The switches 420-424 are provided in correspondence to command signals from the respective rooms 310-314 and can be manually turned on and off. Command signals of turned on switches are added together by the adder 426 and provided from a selective mixed signal output terminal 429. Switches 430-434 and an adder 436 constitute selective mixing circuit 438 of another channel. The switches 430-434 are provided in correspondence to command signals from the respective rooms 310-314 and can be manually turned on and off. Command signals of turned on switches are added together by the adder 436 and provided from a selective mixed signal output terminal 439. In a case where the CD player 320 which is common to the rooms 310-312 is to be operated by the output of the selective mixing circuit 428, the switches 420-422 of the selective mixing circuit 428 are turned on and the switches 423 and 424 are turned off. In a case where the CD player 323 which is common to the rooms 313 and 314 is to be operated, the switches 430-432 of the selective mixing circuit 328 are turned off and the switches 433 and 434 are turned on.

The adder 440 which constitutes the all mixing circuit adds command signals from all rooms and provides an all mixed signal from all mixed signal output terminals 446 and 448 to the cassette tape recorder 322 which is common to the rooms 310-314 through amplifiers 442 and 444. In a case where it is unnecessary to provide independent receivers 318-0 to 318-4 in all of the five rooms 310-314, a receiver for a room which is frequently used may be operated by an independent signal and another receiver may be used commonly for the remaining rooms and may be operated by a selective mixed signal. For example, there may be provided three receivers, one being used exclusively by room 1, another by room 2 and the remaining one receiver being used commonly by rooms 3, 4 and 5. In this case, independent signals will be transmitted to the respective receivers in the rooms 1 and 2 and, for the rooms 3-5, corresponding switches of selective mixing circuit will be operated to transmit a sum signal to the single common receiver. In a case where source devices such as a CD player and cassette tape recorder are to be used exclusively by one room, an independent signal output for that room is transmitted to the particular source device.

In FIG. 10, an expansion terminal 449 is provided for enabling the acoustic device to be used by up to ten rooms by using two command signal input/output units 356. By connecting the two command signal input/output units 356 to each other through the expansion terminals 449, the all mixed signals of the respective units 356 are transmitted in two directions and mixed together and provided from the all mixed output terminals 273 and 448 whereby source devices which are commonly used by all rooms, e.g., ten rooms, can be controlled from all of the ten rooms.

Figure 11:
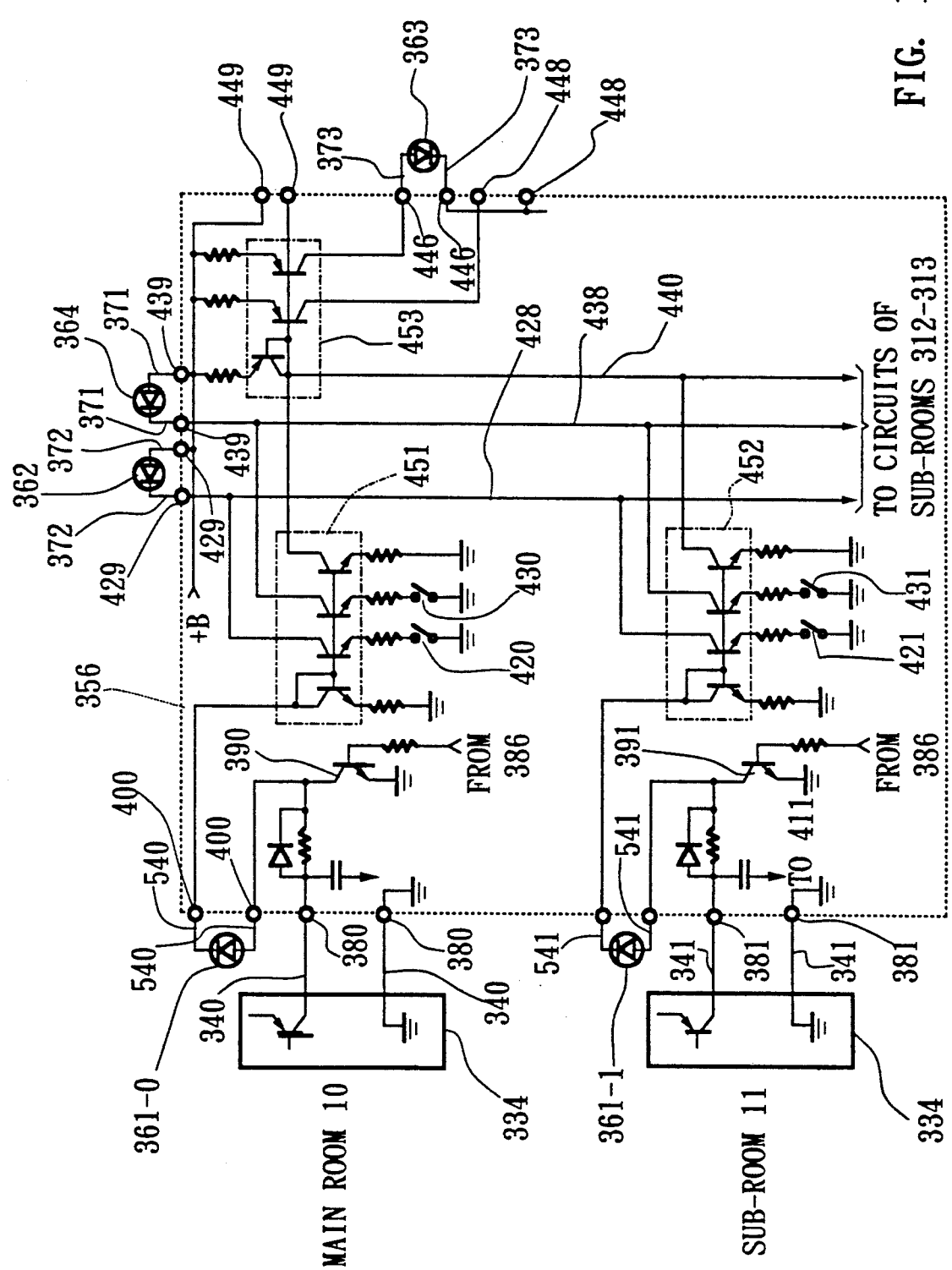
FIG. 11 is a circuit diagram showing a specific example of a circuit of the command signal input/output unit 356.

FIG. 11 is a specific example of circuit construction of the command signal input/output unit 356. In this figure, portions for the main room 310 and the sub-room 311 only are illustrated but the other sub-rooms 312 to 314 have the same construction. In FIG. 11, the same component parts as those in FIG. 10 are designated by the same reference characters. In this circuit, received signal output from the receiving unit 334 is of a current level which is sufficient for actuating the re-transmission LED and, accordingly, this current is used directly as an independent signal and the same current is produced by current mirror circuits 451-453 and supplied as the selective mixed signal and all mixed signal.

A command signal current from the main room 310 is applied at the input terminal 380. When the transistor 390 is on-off state on the basis of a command from the microcomputer 386, this command signal current is provided from an independent signal output terminal 400 and supplied to a re-transmission LED 361-0 for re-transmission. When the transistor 390 is in an on-state, the command signal current flows to the ground and therefore is not re-transmitted. The same operation applies to the other rooms.

When the transistor 390 is in an off-state, the command signal current is supplied to the current mirror circuit 451. When a selection switch 420 is set to an on state, the command signal is mixed with a command signal which is selected for another room on a cable 428 (selective mixing means) and provided from a selective mixed signal output terminal 429 and supplied to a re-transmission LED 362 for re-transmission. When a selection switch 430 is set to an on state, the command signal is mixed with a command signal which is selected for another room on a cable 438 (selective mixing means) and provided from a selective mixed signal output terminal 439 and supplied to a re-transmission LED 364 for re-transmission. A cable 440 (all mixing means) mixes command signals from all rooms and provides an all mixed signal to all mixed signal output terminals 446 and 448 through the current mirror circuit 453 for re-transmission by the re-transmission LED 363. An expansion terminal 449 produces an all mixed signal.

In this embodiment, a command signal is transmitted to the acoustic device main unit by means of a repeater. The invention is applicable also to a system transmitting a command signal by a cable. A remote controller can be used not only for transmitting infrared but also for transmitting a radio signal. This invention is applicable not only to rooms in a house but all spaces which are divided in zones.

What is claimed is:

1. An acoustic device for utilizing in a plurality of zones which are substantially acoustically partitioned from each other, the acoustic device comprising:
 a plurality of loudspeakers located in the plurality of zones respectively;
 an acoustic device main unit which is located in one of the plural zones and is capable of providing an audio source signal and is capable of adjusting a provision state of the audio source signal;
 audio signal transmission paths for transmitting the audio source signal provided by the acoustic device main unit to the plurality of loudspeakers;
 remote control means for remotely controlling the provision state of the audio source signal of the acoustic device main unit, the remote control means comprising,
 remote controllers provided in the plurality of zones, for designating a command for controlling the provision state of the audio source signal of the acoustic device main unit and for producing a command signal according to a designated command,
 command signal receiving means for receiving the command signal produced by the remote controller,
 a command signal transmission path for transmitting the command signal received by the command signal receiving means to the acoustic device main unit;
 transmission path on/off switch means provided in each of the audio source signal transmission paths, for switching a transmission state of the transmission paths; and
 switch control means for controlling the transmission path on/off switch means, the switch control means comprising,
 inputting means for inputting the command signal received by the command signal receiving means,
 identifying means for identifying, in response to an inputted command signal which is a zone independent command for switching one of the audio signal transmission paths by means of the transmission path on/off switch means, the zone where the inputted command signal is provided, and
 switching designation means for designating switching of the transmission path on/off switch means so that the audio signal transmission path corresponding to the identified zone is switched.

2. An acoustic device for utilizing in a plurality of zones which are substantially acoustically partitioned from each other, the acoustic device comprising:
 an acoustic device main unit which is a combination of a plurality of acoustic device sub-units and is capable of providing an audio source signal;
 audio signal supply paths for supplying the audio signal provided from the acoustic device main unit to the plural zones;
 command signal producing means for producing a command signal for operating the acoustic device main unit individually from each of the zones;
 independent signal supply paths for supplying a command signal produced from one of the zones exclusively to a specified acoustic device sub-unit provided in the acoustic device main unit exclusively for said zone; and selective mixed signal supply paths for combining the command signals from any selected zones among the plural zones and supplying a combined command signal to a specified acoustic device sub-unit provided in the acoustic device main unit commonly for these selected zones.

3. An acoustic device as defined in claim 2 further comprising an all mixed signal supply path for combining the command signals from all of the plural zones and supplying a combined command signal to an acoustic device provided in the acoustic device main unit commonly for all of these zones.

4. An acoustic device for utilizing in a plurality of zones which are substantially acoustically partitioned from each other, the acoustic device comprising:

an acoustic device main unit which is a combination of a plurality of acoustic devices sub-units and is capable of providing an audio source signal;

audio signal supply paths for supplying the audio signal provided from the acoustic device main unit to the plural zones;

command signal producing means for producing a command signal for operating the acoustic device main unit individually from each of the zones; and a command signal input-output unit comprising command signal input terminals for receiving command signals from said zones, independent signal output terminals for transmitting an inputted command signal exclusively to an acoustic device sub-unit provided in the acoustic device main unit for a corresponding one of the zones, selective mixing means for combining command signals of specified zones among the inputted command signals, selective mixed signal output terminals for transmitting selective combined command signal provided from the selective mixing means to an acoustic device sub-unit provided in the acoustic device main unit commonly for the selected zones, all mixing means for combining all of the inputted command signals, and an all mixed signal output terminal for transmitting an all combined command signal provided from the all mixing means to an acoustic device sub-unit provided in the acoustic device main unit commonly for all of the plural zones.

5. An acoustic device as in claim 1 wherein:

the identifying means comprises a processor means for decoding the command signal and determining whether it is a system on/off command for switching an audio signal transmission path and providing a first signal in response to a system on command and a second signal in response to a system off command; and the switching designation means comprises relay means which are energized to close the transmission path on/off switch means in response to the first signal and to open the switch means in response to the second signal.

* * * * *